(12) United States Patent
Gaalema et al.

(10) Patent No.: US 9,197,233 B2
(45) Date of Patent: Nov. 24, 2015

(54) LOW POWER ADC FOR HIGH DYNAMIC RANGE INTEGRATING PIXEL ARRAYS

(71) Applicant: Black Forest Engineering LLC, Colorado Springs, CO (US)

(72) Inventors: Stephen Gaalema, Colorado Springs, CO (US); William Bahn, Colorado Springs, CO (US); David Dobyns, Colorado Springs, CO (US); Tue Tran, Colorado Springs, CO (US)

(73) Assignee: Black Forest Engineering, LLC, Colorado Springs, CO (US)

( * ) Notice: Subject to any disclaimer, the term of this patent is extended or adjusted under 35 U.S.C. 154(b) by 0 days.

(21) Appl. No.: 14/492,310

(22) Filed: Sep. 22, 2014

(65) Prior Publication Data

US 2015/0288376 A1 Oct. 8, 2015

Related U.S. Application Data

(60) Provisional application No. 61/884,601, filed on Sep. 30, 2013.

(51) Int. Cl.
*H03M 1/12* (2006.01)
*H04N 5/365* (2011.01)
*H04N 5/378* (2011.01)

(52) U.S. Cl.
CPC ............... *H03M 1/12* (2013.01); *H04N 5/3653* (2013.01); *H04N 5/378* (2013.01)

(58) Field of Classification Search
CPC .......... H03M 1/12; H03M 1/82; H03M 1/60; H03M 1/50; H04N 5/378; H04N 5/3653; H04N 5/37455; H04N 5/3745
USPC .................................. 341/155, 164, 169, 172
See application file for complete search history.

(56) References Cited

U.S. PATENT DOCUMENTS 6,977,601 B1 * 12/2005 Fletcher et al. ............... 341/143
8,625,012 B2 * 1/2014 Yuan et al. .................... 348/296
9,024,243 B2 * 5/2015 Rostaing et al. ........... 250/208.1

* cited by examiner

*Primary Examiner* — Khai M Nguyen

(57) ABSTRACT

In one or more embodiments, an apparatus and method for processing an analog signal into a digital signal includes an input current buffer circuit, a signal charge integration node, a dual function comparator, a step charge subtractor, a state latch, a coarse N-bit counter, an optional residue signal buffer and a residue signal M-bit time-to-digital (TDC) converter. The circuitry is free running, meaning that it is never reset. Instead, what is tracked for each frame is how much additional charge has been accumulated since the end of the previous integration period. Between each frame, the state of the counter and the amount of charge residing in the integration node are recorded. This information from the beginning and end of a given frame is differenced and to this is added the amount of charge indicated by the number of times the counter overflowed during the integration period.

11 Claims, 6 Drawing Sheets ical field of the invention

LOW POWER ADC FOR HIGH DYNAMIC RANGE INTEGRATING PIXEL ARRAYS

CROSS-REFERENCE TO RELATED APPLICATION

This application claims the benefit of U.S. Provisional Application No. 61/884,601, filed 30 Sep. 2013.

STATEMENT REGARDING FEDERALLY SPONSORED RESEARCH OR DEVELOPMENT

This invention was made with Government support under SBIR contract No. HQ0147-12-C-7808 awarded by the Missile Defense Agency. The Government has certain SBIR Data rights in this invention.

TECHNICAL FIELD OF THE INVENTION

The teachings herein relate to a low power analog to digital conversion (ADC) that is particularly advantageous for use with sensors of an array.

BACKGROUND OF THE INVENTION

Advanced focal plane arrays (FPAs), such as infrared focal plane arrays (IRFPAs) utilize embedded ADCs on the read out integrated circuitry (ROIC) die. On-ROIC digital readout allows on-chip digital signal processing, increased dynamic range, and increased signal to noise ratio. On-ROIC ADC is often incorporated at one or more FPA outputs or at ROIC columns. More ADCs on the ROIC tend to provide increased digital resolution and reduced ADC power due to reduced digitization frequency.

One serious limitation of current ROIC technology is the difficulty of achieving very large charge capacity in small pixel pitch. Analog circuits do not scale well because voltages and capacitances are reduced and transistor noise increases for smaller technologies and sizes. There have been efforts to overcome these analog limitations by implementing an A/D converter in each pixel, but those we are aware of have significant problems with high noise, large power dissipation and require extremely expensive non-recurring costs for very small design rule CMOS tooling. The ADC per pixel concept (also referred to as a digital pixel sensor (DPS)) has increased difficulty of implementation in large format mega-pixel FPAs as pixel pitch is reduced (<30 µm), ADC resolution increased (>14-bits) and FPA frame rate is increased (>60 Hz).

In-pixel ADC can be accomplished by counting charge packets integrated on $C_{INT}$ from the detector current $I_{det}$. In FIG. 1A, prior art, the photocurrent, created by the illumination, discharges $C_{INT}$ until $V_{int}$ equals $V_{th}$ (also referred to as $V_{ref}$), then the comparator commands the injection of $Q_0$ at the integration node and the counter is incremented by one. At the end of the integration time, the counter contains the number N. Since the LSB value of the A/D conversion is $Q_0$, $N \cdot Q_0$ has been detected. In FIG. 1B, prior art, the charge packet reset is replaced by a voltage reset. The only difference between the two techniques is the way $Q_0$ is generated. In the "voltage reset" case, FIG. 1B, $Q_0 = C_{int} \cdot \Delta V = C_{int} \cdot (Vo - V_{th})$ and consequently the LSB is highly dependent on $V_{th}$. This technique is thus very sensitive to the performance of the comparator but allows an efficient layout. In the "charge reset" case, FIG. 1B, $Q_0$ is generated by a charge injector, thus it relaxes constraints on the comparator and on $C_{INT}$ precision, providing the charge injector has good performance.

Both techniques, in FIG. 1A and FIG. 1B, require a binary counter per pixel that can occupy a significant amount of the readout pixel area, especially for a large number of bits and small pixel pitch. The repeated voltage reset or charge reset of $C_{INT}$ adds additional temporal noise.

A two-step ADC has been utilized to reduce in-pixel counter size and reduce ADC power. FIG. 2 shows prior art where the first 11-bits are determined by a charge counting architecture at the pixel-level and the last 5-bits are determined by a column level ADC. As illustrated on FIG. 2, the pixel uses a pixel-level ADC technique that consists in counting charge packets so that, at the end of the integration time, the pixel counter contains a digital value proportional to the total integrated charge and the residue remains on the integration capacitance ($C_{INT}$). In FIG. 2 the in-pixel comparator is used only for the 11-bit in-pixel ADC. Voltage reset on the integration node is utilized. The voltage reset of $C_{INT}$ to Vdd adds additional reset noise (kTC$_{INT}$).

FIG. 3, prior art, shows a two-step ADC where the most significant bits (MSBs) are determined in the pixel and the least significant bits (LSBs) are determined by digitization of the residual signal integrated on $C_{INT}$. The LSB residual signal A/D conversion occurs external to the pixel. In FIG. 3, charge reset is utilized. A FET and first switch are disposed in series between a dump capacitor and the integration node. A second switch operates to discharge the dump capacitor, and an output of the comparator controls both switches in opposition. Upon command of the comparator circuitry, the integration capacitor transfers a fixed amount of charge into the dump capacitor through an injection FET with $V_g = V_{ref\,2}$ operating in saturation.

In FIG. 3, the bottom of the dump capacitor may be connected to a special reference voltage, but ground can be used when layout constraints exist. The common potential $V_{comm}$ may differ between the integrating and dump capacitors. Noise is added at the end of every charge dump event.

In a preferred embodiment, the circuit of FIG. 3 operates in a 5-volt system, $V_{ref1}$ is 3.3 volts, and $V_{ref2}$ is 2.5 volts. The values of $C_{int}$ and $C_{dump}$ are chosen such that the voltage at the integration node $V_{int}$ does not fall below 2.5 volts ($V_{ref2}$). The repeated charge reset of $C_{INT}$ adds additional reset noise (kTC$_{dump}$).

BRIEF SUMMARY OF THE INVENTION

The foregoing and other problems are overcome by methods and apparatus in accordance with embodiments of this invention. Therefore, it is considered that the embodiments provided herein are illustrative only, and are not to be considered limiting of the invention.

In one or more embodiments, an apparatus and method for processing an analog signal into a digital signal includes an optional input current buffer circuit, a signal charge integration node with integration capacitor, a dual function comparator, a step charge subtractor with associated step charge capacitor, a state latch, a coarse (MSB) N-bit counter, an optional residue signal buffer and a residue signal (LSB) M-bit time-to-digital converter.

The circuit is best described with reference to a node termed an integration node. An integration capacitor ($C_{INT}$) is connected to the integration node. The comparator has a first input connected to the integration node and a second input connected to a reference voltage $V_{CMP}$ that is preferably supplied externally and independent of the voltage within the circuit deriving from an input signal.

A second capacitor is termed a step charge capacitor ($C_{SC}$), and has a first node connected to a step voltage clock $\varnothing_{STEP}$ and a second node connected to a step charge node. A step charge subtractor circuit is connected between the step charge node and integration node with an insolation transistor controlled by a voltage Vs. A state latch sends a signal to the state charge subtractor to subtract a fixed amount of charge from the integration node. The step clock voltage, $\emptyset_{STEP}$, is typically much larger than the ROIC analog supply voltage (~3.3-5.0 volts). Large $\emptyset_{STEP}$ amplitude allows a significant reduction in $C_{SC}$ capacitance for a fixed amount of step charge and a significant reduction in charge reset noise (related to $kTC_{SC}$).

In another aspect of the invention is a readout circuit. The readout circuit includes a detector input node for receiving a photocurrent generated by a radiation detector. The photocurrent represents the analog signal to be converted by the readout circuit, and refers to any current signal output by the various types of radiation detectors. The circuit further includes an optional detector buffer circuit and an integration capacitor, $C_{INT}$, having a first node coupled to the input node, and a dual function comparator. The dual function comparator input is coupled to the node of the integrating capacitor to provide repeated readout of charge packets and a final reference signal.

The present invention additionally includes a method for converting an analog signal to a digital signal. The method includes inputting an analog current signal to an input node and comparing an electrical parameter at an integration node to a reference electrical parameter. The input node and the integration node are in series with one another. In a first comparator state, preferably where the voltage at the integration node is less than the reference voltage ($V_{CMP}$), the method includes charging a capacitor from the input node which accomplishes the integration. In a second comparator state, preferably where the voltage at the integration node is greater than the reference voltage ($V_{CMP}$) that charge stored on the capacitor is decremented, preferably by a fixed and precise amount into a step charge capacitor via an injection/isolation FET. The charge decrement accomplishes the subtraction. In the preferred embodiment, the parameter after the decrement, voltage at the integration node is once again lower than the reference voltage, and the comparator state reverts to the first state on the next clock edge. By counting the number of decrements, a large portion of the analog signal is converted to a digital signal. Counting the comparator state changes from first to second, from second to first, or both are each included within the term counting the number of decrements.

The present invention additionally includes a method for converting a residue analog signal to a digital signal. The comparator output is used for two functions: during the bulk of the integration period. First, it is used by the state control circuitry in conjunction with a static reference voltage on $V_{CMP}$, to initiate step charge subtraction events. Second, while at the end of each integration period it is used, in conjunction with a ramped reference voltage on $V_{CMP}$, to provide the capture of residue signal and send to the column located time-to-digital (TDC) circuitry.

The concept of this invention is also applied when the photo current is inverted. In this case, step charge circuit adds a fixed charge into the integration node once it goes sufficiently below the trip point of the comparator.

Other variations are disclosed that provide additional details that may remain within one or more particular embodiments. Further variations may become evident to those of ordinary skill in the art without departing from the described principles and claimed invention.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1A:
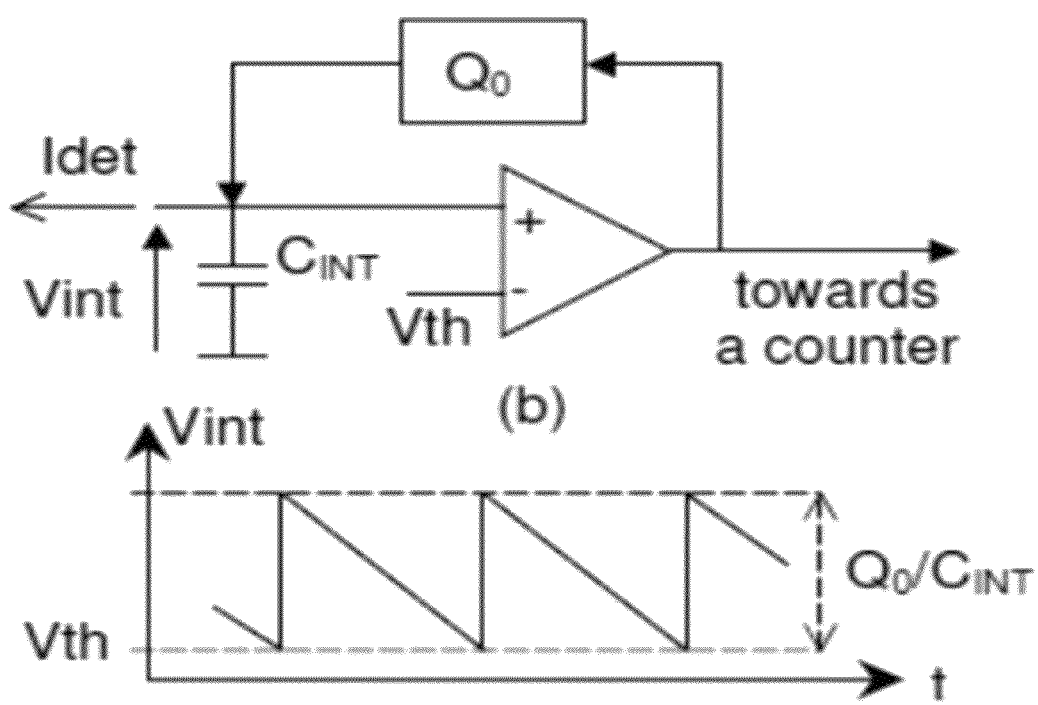
FIG. 1A depicts the basic architecture of a prior art ADC/pixel charge packet counting method with charge reset.
Figure 1B:
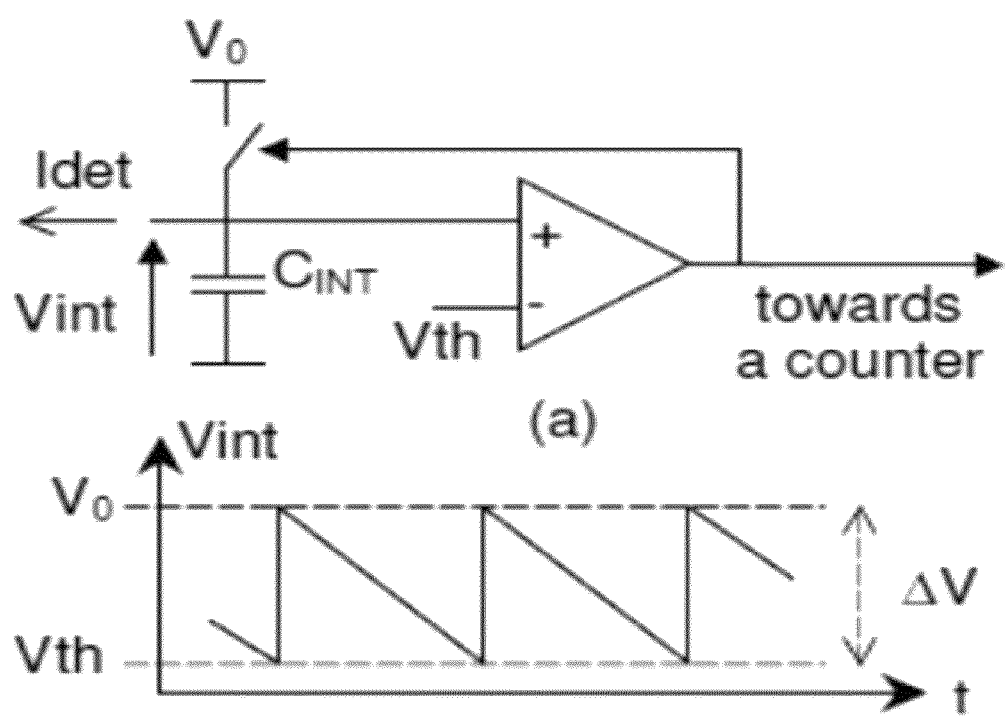
FIG. 1B depicts the basic architecture of a prior art ADC/pixel charge packet counting method with voltage reset.
Figure 2:
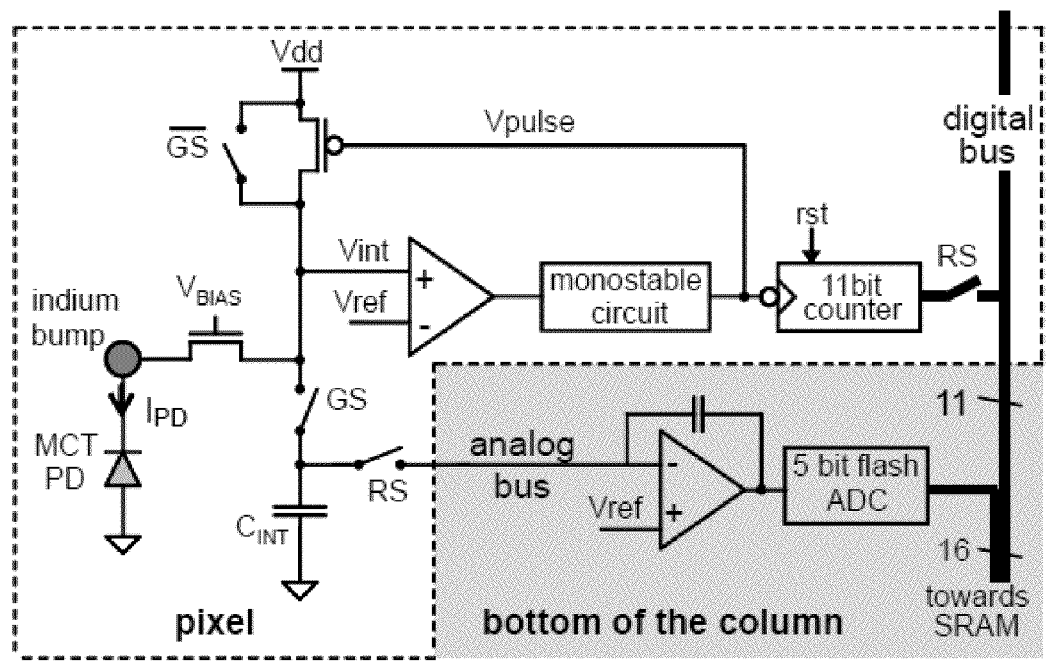
FIG. 2 depicts a prior art enhancement to the basic architecture, referred to as the two-step ADC using in-pixel charge packet counting with voltage reset and residual signal ADC at column.
Figure 3:
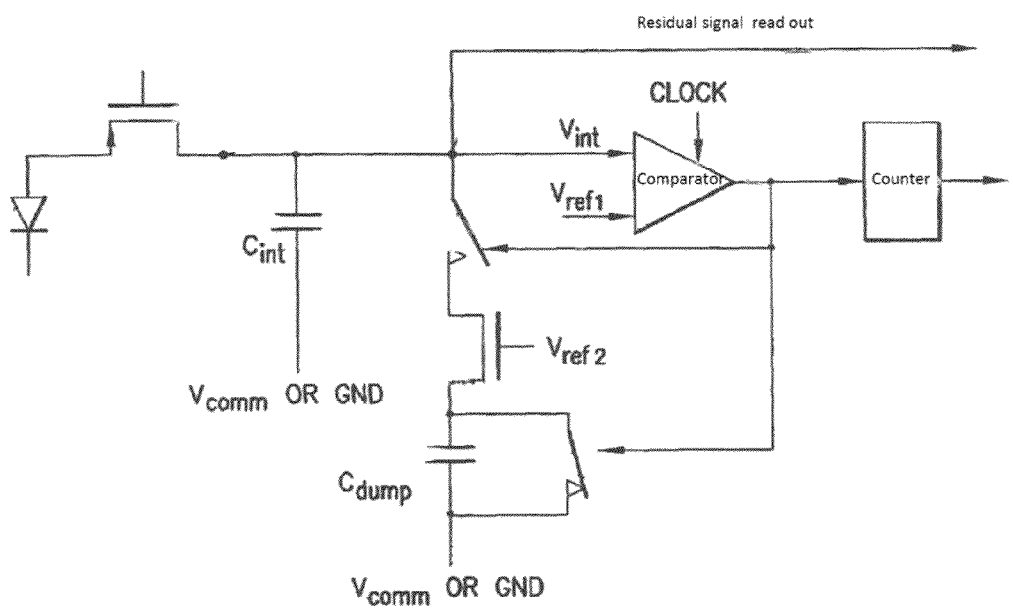
FIG. 3 depicts a prior art enhancement to the basic architecture, referred to as the two-step ADC using in-pixel charge packet counting with charge reset and residual signal ADC at column.
Figure 4:
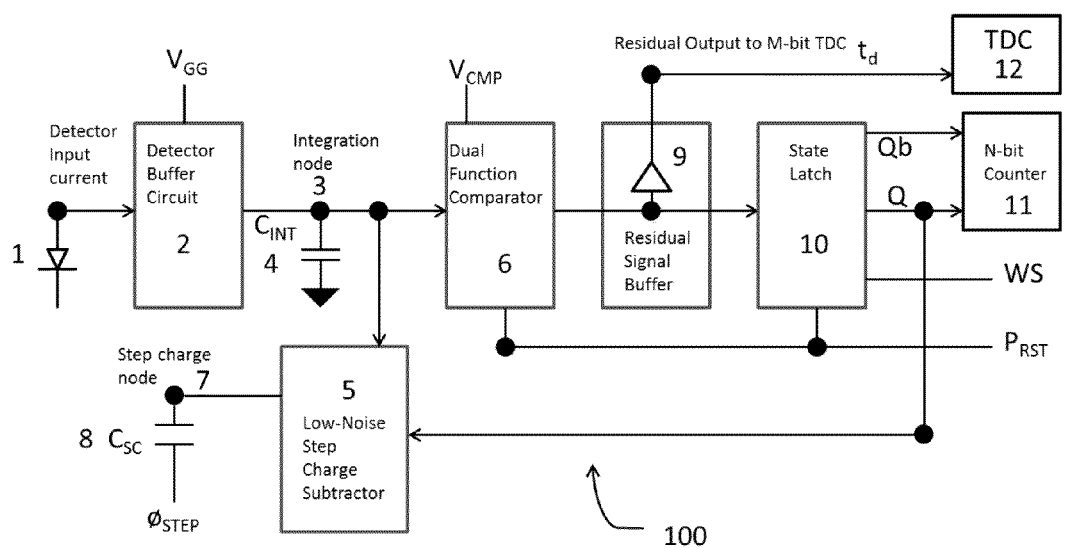
FIG. 4 depicts a block diagram of a two-step ADC using charge packet counting with charge reset and residual ADC according to the teachings herein.

Disclosed herein is a low power two-step ADC, such as one that may be used in a large imaging array. An exemplary embodiment is depicted in FIG. 4. A low power two-step ADC 100 is connected by a detector buffer circuit 2 or other signal conditioning circuitry to detection components, represented as a diode 1. An input integration node 3 is a point at which current from the detector enters the circuit 100 substantially unchanged by the circuit 100. An integrating capacitor 4, a step charge subtractor 5 and a dual function comparator 6 are each connected in parallel to the integration node 3.

The detector buffer circuit 2 isolates the detector from the charge integration node 3 which is dominated by capacitor $C_{INT}$. In some cases, such as a detector with large reverse bias capability, a detector buffer circuit is not required and charge integration can occur directly on the detector capacitance. The most simple detector buffer circuit is am input transistor comprising a low noise PFET source follower that holds a constant voltage on the circuit side of the detector, as determined by VGG, provided the detector is biased sufficient above VGG to keep the detector active. Other buffer circuits can be utilized comprising CMOS or bipolar transistors.

The integration node 3 comprises an integration capacitor 4 ($C_{INT}$), and stray capacitance resulting from connections to the detector buffer circuit 2, dual function comparator 6 and step charge subtractor 5. As detector current flows from the detector buffer circuit (all discussions use conventional current flow), the voltage on the integration node 3 rises. The isolation transistor permits charge to be removed from the integration node by the step charge circuit while preventing charge from flowing onto the integration node as the step charge circuit is reset. When the voltage has risen sufficiently high for the comparator to sense it, a chain of events is initiated that results in one unit of step charge being subtracted from the integration node. An isolation transistor within the step charge subtractor 5 permits charge to be removed from the integration node 3 by the step charge circuit while preventing charge from flowing onto the integration node as the step charge circuit is reset.

A step charge capacitor ($C_{SC}$) 8 is coupled to a step charge node 7 that is connected to the step charge subtractor 5. The step charge subtractor analog circuitry is responsible for performing the step charge subtraction from the integration node 3. The $ø_{STEP}$ signal is a global square wave voltage that alternately pushes and pulls charge onto and off of node 7 in each pixel via each pixel's $C_{SC}$ capacitor 8. The amount of charge transferred is the product of the $ø_{STEP}$ amplitude and the $C_{SC}$ capacitance. On the downward transition of $ø_{STEP}$, each pixel either wants to pull charge off its integration node or forego the opportunity to do so. Most of the time the pixel will want to pass up the opportunity and this occurs when the state control output signal, 'Q', is LO, which turns on the reset transistor within 5 clamping the node 7 to the digital supply and shutting off the isolation transistor, the forces the charge pulled through $C_{SC}$ to come from the digital supply and not the integration node. Similarly, on the rising edge of $ø_{STEP}$, the charge pushed through C2 will be delivered to the digital supply and not pushed onto the integration node 3. However, when 'Q' is HI, the reset transistor is turned off and charge is pulled from the integration node 3 on the falling edge of $ø_{STEP}$. Prior to $ø_{STEP}$ the next rising edge of $ø_{STEP}$, the reset is reasserted by taking 'Q' LO again.

If the detector input signal exceeds the integration node charge capacity, as set by $V_{CMP}$ in the comparator 6, then the step-charge subtraction circuit will remove one step charge from the integration node. Each time this happens, there is an uncertainty in the amount of charge actually removed due to the thermal noise of the step capacitor. This noise, which is the square root of kTC, where k is Boltzmann's constant, T is the absolute temperature, and C is the step capacitor size ($C_{SC}$), is very low because the use of a low capacitance combined with a large $ø_{STEP}$ amplitude. Since this uncertainty exists in each step charge subtraction that is carried out and since these errors are statistically independent, the accumulated error is the individual error multiplied by the square root of the number of step charge subtractions. The $C_{SC}$ capacitor 8 is capable of withstanding a large voltage and can be fabricated from with metal-insulator-metal layers (MIM) in the integrated circuit process. A large push-pull voltage swing across $C_{SC}$ allows a reduction in $C_{SC}$ capacitance and resultant reduction in kTC noise compared to charge dump approaches using low analog supply voltages and MOS capacitors.

Comparator 6 is a dual function comparator used for both steps of the two-step ADC 100. During coarse signal integration, the reference voltage, $V_{CMP}$, is held constant. At the end of the frame, when it is necessary to measure the residual charge on the integration node 3, a special comparison cycle is performed in which the comparison voltage is ramped downward from a voltage slightly higher than the normal value of $V_{CMP}$. At the same time this ramp starts its descent, a Gray Code counter is launched in the ROIC chip periphery and the output distributed to all of the column buffers. When the comparator fires, the 'td' pixel output 9, which is enabled only during this task, tells the column buffer to capture the present Gray Code counter state. Since each column buffer can only capture a single value at a time, and since the 'td' column line is shared by multiple rows, this process must be repeated for each row, with the caveat that the array can be parsed so half of the rows are read out the top and half read out the bottom, enabling two rows to be read out simultaneously. Additionally, if there is sufficient room for additional column lines and additional capture registers in the column buffers, then multiple rows can be read out simultaneously.

The state latch 10 is used to capture the knowledge that the integration node has risen above the comparator trip point and hold it until it has been properly acted upon. The storage element is an SRAM cell formed by two cross-coupled inverters. This simple latch can be reset by taking the Prst signal HI. To set the latch, both the comparator output and the write strobe (WS) input must be HI.

Once the latch is reset by stroking Prst HI, the comparator output is sampled by stroking the WS HI. If the latch is set, the 'Q' and 'Qb' outputs will act as a complementary clock pair to clock the pixel's ripple counter 11. After WS returns LO, the $ø_{STEP}$ voltage is ramped downward and, if the latch is set, one step charge is removed from the integration node. At this point, Prst is asserted again to clear the latch prior to rising transition of $ø_{STEP}$.

The N-bit digital section 11 is shown in FIG. 4. To detect a counter overflow during integration, the most significant bit of the counter is periodically polled (read out) by the peripheral circuitry. In order not to miss an overflow, this polling must occur frequently enough to ensure that the MSB is read at least once between each pair of transitions. In order to facilitate a fast polling rate, the four column lines devoted to the counter output bits are rotated between the four bits every four rows. Thus, four rows can be read out simultaneously, with one row's MSB driven onto each of the four column lines.

During the end of frame readout, when it is necessary to read out the entire counter state, both the MSB and the lower-order bit lines are driven onto the column lines one row at a time. Because the lines are rotated through a complete cycle every four rows, either the peripheral circuitry on the chip or the off-chip software must reverse the rotation. Unless column header space is at a premium, performing this task on-chip is very straightforward and would make the management of this approach completely on-chip, thus not only simplifying the off-chip software, but making future changes to how these bits are read out of the array invisible beyond the chip boundary.

Because the counter accounts for the bulk of the transistors in the pixel, minimizing the transistor count and size associated with each stage is crucial to attaining a small pixel size. To this end, the design allows for non-resettable flip flops to be used. Furthermore, because each latch operates strictly within the confines of one pixel, buffering and internal clock generation can be eliminated through careful simulation. This permits normal D-type flip-flop to be trimmed from its normal 30-transistors to only 12. Another option is the use of a linear-feedback shift register (LSFR) using dynamic flip flops in place of the ripple counter.

The TDC (time-to-digital converter) 12 works by ramping a reference voltage across the range of voltages that the unknown voltage could be and measuring the time it takes for the reference voltage to match the unknown voltage. The time is measured by running a digital counter and capturing the count when the two voltages are equal. Because the value recorded is the difference between measurements taken at the end of one frame and the end of the next, the uncertainty in this value is +/−1 LSB. Since the TDC read noise does not depend on the integrated signal charge, it quickly becomes an insignificant noise source compared to the shot noise as the signal magnitude increases.

During each frame, the pixel is guided through a sequence built from a set of four states: 1) Counter Readout, 2) Counter Overflow Detection, 3) Step Charge Maintenance and 4) Residual Charge Readout. At the beginning of each frame, the state of each in-pixel counter is read out. After that, and for the bulk of the frame period, the pixel alternates performing Counter Overflow Detection and Step Charge Maintenance operations. At the very end of the frame period, a Residual Charge Readout is performed. To generate the image data for the present frame, the data read out during that frame must be combined with the residual charge value from the previous frame and the counter value that will be read out at the beginning of the following frame. Between each frame, the state of the counter and the amount of charge residing in the sub-integration well are recorded. This information from the beginning and end of a given frame is then differenced and to this is added the amount of charge indicated by the number of times the counter overflowed during the frame.

Figure 5:
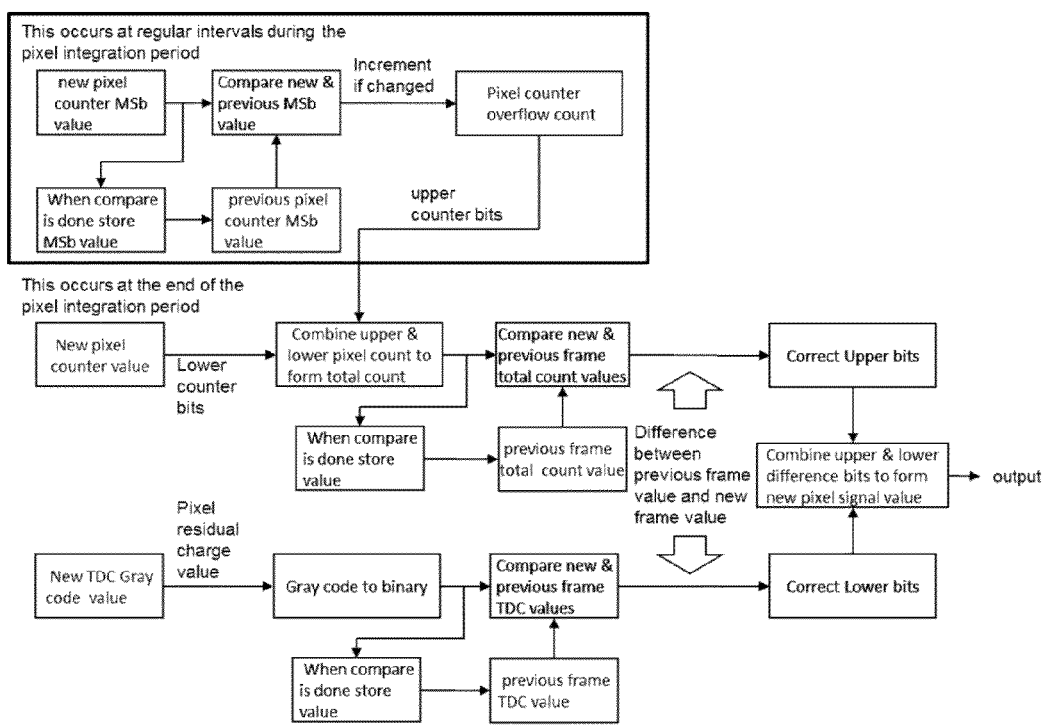
FIG. 5 depicts signal processing steps done at ROIC periphery or off ROIC

Processing the data output by the ROIC column is accomplished by the data path as shown in FIG. 5. When the step charge counter roll over value is combined with the step charge counter value it forms the total step charge count value. The total step charge value then can be compared to the previous frames total step charge value to arrive at the bases for the current frame signal upper bits. The TDC Gray code value is converted to binary by the ROIC. The TDC binary value forms the bases for the lower bits of the current frame signal value.

What is claimed is:

1. A circuit for converting an input analog current signal into an output digital signal, comprising:
   an input current from a detector;
   a detector buffer circuit having its input coupled to a detector and its output coupled to a charge integration node;
   an integration capacitor coupled to the integration node;
   a step charge subtractor coupled to the integration node;
   a dual function comparator coupled to the integration node;
   a step charge node coupled to the step charge subtractor;
   a step charge capacitor having a first plate coupled to the step charge node and an opposed second plate coupled to a push-pull voltage swing;
   a residual signal buffer coupled to the dual function comparator output;
   a state latch input coupled to the dual function comparator output;
   a n-bit counter input coupled to the state latch output; and
   a m-bit time-to-digital converter couple to the residual signal buffer output.

2. The circuit of claim 1 wherein the step charge capacitor is fabricated by metal-insulator-metal construction and can tolerate voltages significant larger than the transistor supply voltage.

3. The circuit of claim 1 wherein a push-pull high voltage swing across the step charge capacitor allows a reduction in step charge capacitance and a resultant reduction in thermal noise compared to using a voltage swing magnitude comparable to lower transistor supply voltages.

4. The circuit of claim 1, wherein a dual function comparator is used for both steps of a two-step ADC and wherein the circuit further comprises;
   a coarse signal integration, during which the comparator reference voltage is held constant; and
   a residual charge comparison cycle in which the reference voltage is ramped downward from a voltage higher than the coarse signal integration value of the comparator reference voltage.

5. The circuit of claim 1 wherein the m-bit counter uses non-resettable flip flops to reduce transistor count compared to resettable flip-flop counter circuitry.

6. The circuit of claim 1 wherein the m-bit counter uses non-resettable flip flops to reduce transistor count compared to resettable flip-flop counter circuitry.

7. The circuit of claim 1 where in the pixel is free running and is not reset and wherein the circuit further comprises;
   counter overflow detection during integration, where the most significant bit of the m-bit counter is periodically polled (read out) by the peripheral circuitry.

8. A method of reading out, during each integration time, an analog input signal as a digital count comprising the steps of:
   controlling a counter readout,
   controlling a counter overflow detection,
   controlling a step charge maintenance, and
   controlling a residual charge readout.

9. The readout method of claim 8 wherein at the beginning of each frame, the state of each in-pixel counter is read out.

10. The readout method of claim 8 wherein during the frame integration period, the pixel alternates performing counter overflow detection and step charge maintenance operations.

11. The readout method of claim 8, wherein at the end of the frame integration period, residual charge readout is performed.

* * * * *